US008430970B2

(12) United States Patent
Swami et al.

(10) Patent No.: US 8,430,970 B2
(45) Date of Patent: Apr. 30, 2013

(54) METHODS FOR PREVENTING CORROSION OF PLASMA-EXPOSED YTTRIA-COATED CONSTITUENTS

(75) Inventors: Ganapathy Swami, Fremont, CA (US); Peter Loewenhardt, Pleasanton, CA (US); Yunsang Kim, Monte Sereno, CA (US)

(73) Assignee: Lam Research Corporation, Fremont, CA (US)

( * ) Notice: Subject to any disclaimer, the term of this patent is extended or adjusted under 35 U.S.C. 154(b) by 323 days.

(21) Appl. No.: 12/852,673

(22) Filed: Aug. 9, 2010

(65) Prior Publication Data

US 2012/0031426 A1 Feb. 9, 2012

(51) Int. Cl.
*B08B 7/00* (2006.01)
*B08B 3/00* (2006.01)
*B08B 7/04* (2006.01)

(52) U.S. Cl.
USPC ............ 134/26; 134/6; 134/21; 134/34

(58) Field of Classification Search ............ 134/6, 21, 134/26, 28, 32, 34
See application file for complete search history.

(56) References Cited

U.S. PATENT DOCUMENTS

| | | | |
|---|---|---|---|
| 2005/0161061 A1 | 7/2005 | Shih et al. | |
| 2006/0099444 A1* | 5/2006 | Moriya et al. | 428/655 |
| 2006/0180180 A1* | 8/2006 | Tan | 134/26 |
| 2007/0134416 A1* | 6/2007 | Wang et al. | 427/248.1 |
| 2007/0151581 A1 | 7/2007 | Wang et al. | |
| 2008/0169588 A1* | 7/2008 | Shih et al. | 264/423 |
| 2009/0087615 A1* | 4/2009 | Sun et al. | 428/136 |
| 2009/0133717 A1* | 5/2009 | Moriya et al. | 134/3 |
| 2010/0028572 A1* | 2/2010 | Kobayashi et al. | 428/34.1 |
| 2010/0140224 A1* | 6/2010 | Kanai et al. | 216/67 |

OTHER PUBLICATIONS

International Preliminary Report on Patentability for Application No. PCT/IB/2011/053459 mailed Feb. 12, 2013.

* cited by examiner

*Primary Examiner* — Alexander Markoff
(74) *Attorney, Agent, or Firm* — Dinsmore & Shohl LLP

(57) ABSTRACT

In accordance with one embodiment of the present disclosure, a method for preventing corrosion of a plasma-exposed yttria-coated constituent from ambient acidic hydrolysis wherein the plasma-exposed yttria-coated constituent includes a hydrolysable acid precursor is disclosed. The method may include: removing the plasma-exposed yttria-coated constituent from a semiconductor processing assembly; binding the plasma-exposed yttria-coated constituent with flexible moisture wicking material; hydrolyzing the hydrolysable acid precursor with an overwhelming aqueous admixture to form a vitiated acidic compound, wherein the flexible moisture wicking material pulls the vitiated acidic compound away from the plasma-exposed yttria-coated constituent with capillary action; dehydrating the plasma-exposed yttria-coated constituent with additional flexible moisture wicking material to pull a latent amount of the vitiated acidic compound away from the plasma-exposed yttria-coated constituent; and isolating the plasma-exposed yttria-coated constituent from ambient moisture in a moisture obstructing enclosure.

15 Claims, 1 Drawing Sheet

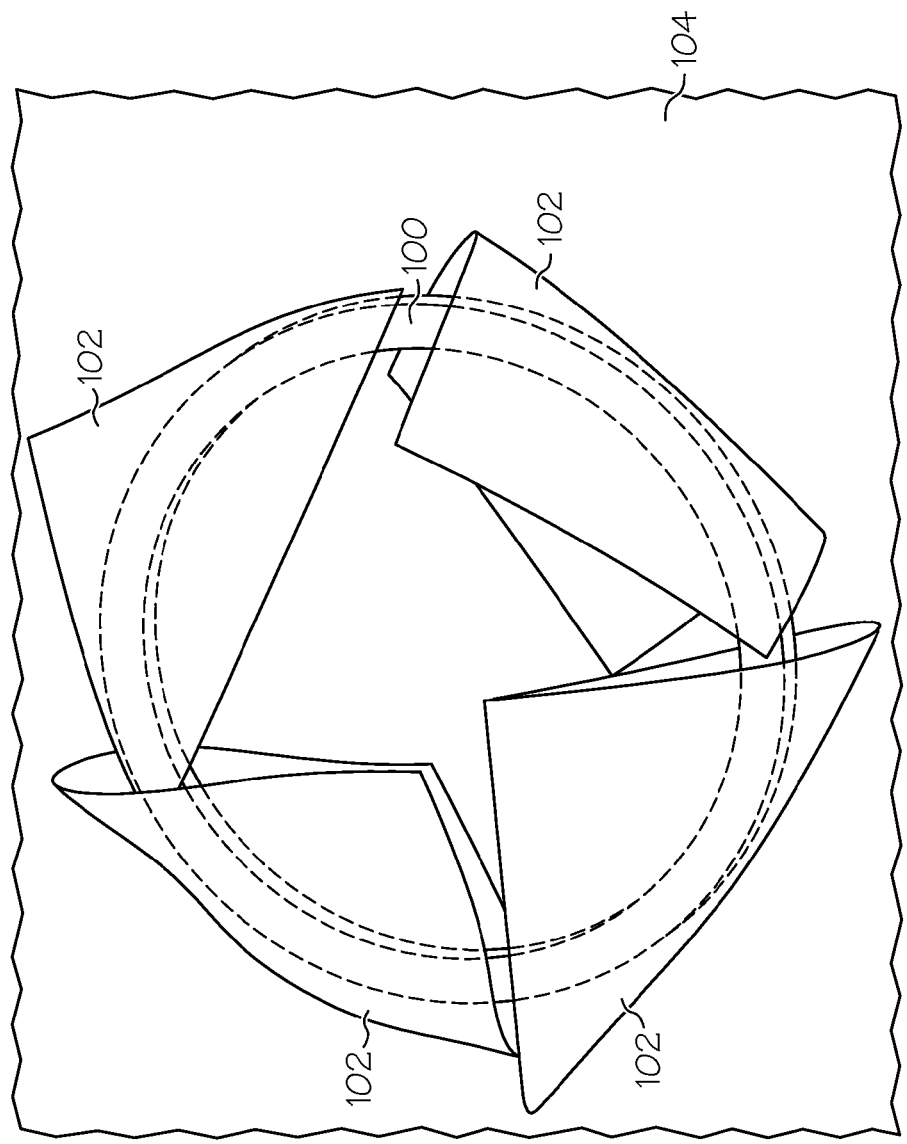

METHODS FOR PREVENTING CORROSION OF PLASMA-EXPOSED YTTRIA-COATED CONSTITUENTS

BACKGROUND

The present disclosure relates generally to plasma processing chamber constituents. More particularly, the present disclosure relates to methods for preventing corrosion of plasma-exposed yttria-coated constituents.

BRIEF SUMMARY

In general, plasma processing chambers are used to process substrates by a variety of techniques including, but not limited to, etching, physical vapor deposition, chemical vapor deposition, ion implantation, resist removal, etc. For example, and not by way of limitation, one type of plasma processing chamber contains yttria-coated constituents, such as, for example an extended electrode.

As will be appreciated by those practicing the present disclosure, the concepts of the present disclosure are applicable to a wide variety of yttria-coated constituents of plasma processing chambers, but not limited to, those illustrated in U.S. Pat. Nos. 7,300,537, 7,311,797, 7,375,046, 7,476,634 and others. The concepts of the present disclosure have been illustrated with reference to relatively simple yttria-coated constituents for clarity but the scope of the present disclosure should not be limited to these relatively simple yttria-coated constituents.

The yttria-coated constituents commonly collect byproducts from exposure to plasma within the reaction chamber during the manufacturing process. Many of these byproducts include hydrolysable acid precursors such as chlorine compounds or fluorine compounds. Once hydrolyzed by ambient moisture the hydrolysable acid precursors may form an acidic compound that damages the yttria coating. Therefore, additional methods for preventing corrosion of plasma-exposed yttria-coated constituents are needed.

In accordance with one embodiment of the present disclosure, a method for preventing corrosion of a plasma-exposed yttria-coated constituent from ambient acidic hydrolysis wherein the plasma-exposed yttria-coated constituent includes a hydrolysable acid precursor is disclosed. The method may include: removing the plasma-exposed yttria-coated constituent from a semiconductor processing assembly; binding the plasma-exposed yttria-coated constituent with flexible moisture wicking material; hydrolyzing the hydrolysable acid precursor with an overwhelming aqueous admixture to form a vitiated acidic compound, wherein the flexible moisture wicking material pulls the vitiated acidic compound away from the plasma-exposed yttria-coated constituent with capillary action; dehydrating the plasma-exposed yttria-coated constituent with additional flexible moisture wicking material to pull a latent amount of the vitiated acidic compound away from the plasma-exposed yttria-coated constituent; and isolating the plasma-exposed yttria-coated constituent from ambient moisture in a moisture obstructing enclosure.

In accordance with another embodiment of the present disclosure, a method for preventing corrosion of a plasma-exposed yttria-coated constituent from ambient acidic hydrolysis wherein the plasma-exposed yttria-coated constituent includes a hydrolysable acid precursor is disclosed. The method may include: removing the plasma-exposed yttria-coated constituent from a semiconductor processing assembly; binding the plasma-exposed yttria-coated constituent with flexible moisture wicking material; hydrolyzing the hydrolysable acid precursor with an overwhelming aqueous admixture to form a vitiated acidic compound, wherein the flexible moisture wicking material pulls the vitiated acidic compound away from the plasma-exposed yttria-coated constituent with capillary action. The hydrolysable acid precursor includes fluorine, chlorine or a combination thereof. The overwhelming aqueous admixture may be applied for at least about 30 minutes. The method may further include: dehydrating the plasma-exposed yttria-coated constituent with additional flexible moisture wicking material to pull a latent amount of the vitiated acidic compound away from the plasma-exposed yttria-coated constituent; and isolating the plasma-exposed yttria-coated constituent from ambient moisture in a moisture obstructing enclosure.

Additional embodiments are disclosed and claimed.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which:

FIG. 1 is a top perspective view of a plasma-exposed yttria-coated constituent bound with flexible moisture wicking material.

DETAILED DESCRIPTION

The various aspects of the present disclosure can be illustrated in the context of a plasma-exposed yttria-coated constituent 100, which is merely illustrated schematically as a ring shaped extended electrode in FIG. 1 to avoid limitation of the concepts of the present disclosure to particular yttria-coated constituents of plasma processing chamber, that may not be integral to the subject matter of the present disclosure. Therefore, yttria-coated constituents include extended electrodes and any other ceramic, metal or semiconductor component of a semiconductor processing assembly that is coated with yttria.

Still referring to FIG. 1, corrosion of a plasma-exposed yttria-coated constituent 100 from ambient acidic hydrolysis may be prevented despite the presence of a hydrolysable acid precursor such as, for example, fluorine, chlorine, or a combination thereof. According to the embodiments described herein, the plasma-exposed yttria-coated constituent 100 is removed from a semiconductor processing assembly. The plasma-exposed yttria-coated constituent 100 is bound with a flexible moisture wicking material 102. Then the hydrolysable acid precursor is hydrolyzed with an overwhelming aqueous admixture to form a vitiated acidic compound. For the purposes of defining and describing the present disclosure, the term "yttria-coated" means that a substrate material is covered with a layer of material comprising yttria or yttrium oxide ($Y_2O_3$).

For example, the plasma-exposed yttria-coated constituent 100 may be sprayed with the overwhelming aqueous admixture or soaked in the overwhelming aqueous admixture. In some embodiments, the overwhelming aqueous admixture comprises de-ionized water. It is noted that the amount of overwhelming aqueous admixture applied to the plasma-exposed yttria-coated constituent 100 may vary, but should be sufficient enough to dilute the hydrolysable acid precursor. Furthermore, it is noted that the overwhelming aqueous admixture may be applied for at least about 5 minutes with improved results corresponding to longer application, e.g., at least about 20 minutes shows improvement compared to at least about 5 minutes, and at least about 30 minutes shows improvement compared to at least about 20 minutes.

The vitiated acidic compound is pulled away from the plasma-exposed yttria-coated constituent 100 with capillary action of the flexible moisture wicking material 102. The plasma-exposed yttria-coated constituent 100 is then dehydrated with additional flexible moisture wicking material to pull a latent amount of the vitiated acidic compound away from the plasma-exposed yttria-coated constituent 100. In one embodiment, the plasma-exposed yttria-coated constituent 100 is dehydrated by applying an unsaturated flexible moisture wicking material to the latently hydrated surface of the plasma-exposed yttria-coated constituent 100. Once dehydrated, the plasma-exposed yttria-coated constituent 100 is isolated from ambient moisture in a moisture obstructing enclosure such as, for example, a bag, a plastic enclosure, wax, or oil.

In one embodiment, the plasma-exposed yttria-coated constituent 100 is supported on a non-reactive water tight surface 104. For example, the plasma-exposed yttria-coated constituent 100 may be processed while supported by a stable surface comprising plastic, glass, or any other non-acid soluble material.

In another embodiment, semiconductor fabrication byproduct is removed from the plasma-exposed yttria-coated constituent 100 with a suction device. For example, portions of the hydrolysable acid precursor may be loosely adhered to a surface of the plasma-exposed yttria-coated constituent 100. Because of the low surface adhesion, a brush or a suction device such as a vacuum may be used to remove portions of the hydrolysable acid precursor.

In the embodiments described herein, the flexible moisture wicking material 102 may be a low particle generation wipe suitable for use in a cleanroom. Low particle generation wipes such as, but not limited to, TekniClean Cleanroom Wipers or Teknizorb Cleanroom Wipers are commercially available from Teknipure of Chandler, Ariz. For the purposes of defining and describing the present disclosure, it is noted that the term "cleanroom" means an environment where the level of air pollutants are controlled. Example cleanroom standards such as US FED STD 209E, ISO 14644-1, and BS 5295 offer further guidance regarding cleanrooms. However, it should be noted that such standards are included for clarification, rather than for limitation.

Having described the disclosure in detail and by reference to specific embodiments thereof, it will be apparent that modifications and variations are possible without departing from the scope of the disclosure defined in the appended claims. More specifically, although some aspects of the present disclosure are identified herein as preferred or particularly advantageous, it is contemplated that the present disclosure is not necessarily limited to these preferred aspects of the disclosure.

What is claimed is:

1. A method for preventing corrosion of a plasma-exposed yttria-coated constituent from ambient acidic hydrolysis wherein the plasma-exposed yttria-coated constituent comprises a hydrolysable acid precursor, the method comprising:
   removing the plasma-exposed yttria-coated constituent from a semiconductor processing assembly;
   binding the plasma-exposed yttria-coated constituent with flexible moisture wicking material, then hydrolyzing the hydrolysable acid precursor with an overwhelming aqueous admixture to form a vitiated acidic compound, wherein the flexible moisture wicking material pulls the vitiated acidic compound away from the plasma-exposed yttria-coated constituent with capillary action;
   dehydrating the plasma-exposed yttria-coated constituent with additional flexible moisture wicking material to pull a latent amount of the vitiated acidic compound away from the plasma-exposed yttria-coated constituent; and
   isolating the plasma-exposed yttria-coated constituent from ambient moisture in a moisture obstructing enclosure.

2. The method of claim 1 further comprising supporting the plasma-exposed yttria-coated constituent on a non-reactive water tight surface.

3. The method of claim 2 wherein the non-reactive water tight surface comprises plastic.

4. The method of claim 1 further comprising removing semiconductor fabrication byproduct from the plasma-exposed yttria-coated constituent with a suction device.

5. The method of claim 1 further comprising removing semiconductor fabrication byproduct from the plasma-exposed yttria-coated constituent with a brush.

6. The method of claim 1 wherein the overwhelming aqueous admixture comprises de-ionized water.

7. The method of claim 1 wherein the hydrolysable acid precursor comprises a combination of fluorine and chlorine.

8. The method of claim 1 wherein the hydrolysable acid precursor comprises fluorine.

9. The method of claim 1 wherein the hydrolysable acid precursor comprises chlorine.

10. The method of claim 1 wherein the moisture obstructing enclosure comprises plastic.

11. The method of claim 1 wherein the moisture obstructing enclosure is a bag.

12. The method of claim 1 wherein the overwhelming aqueous admixture is applied for at least about 30 minutes.

13. The method of claim 1 wherein the plasma-exposed yttria-coated constituent is processed while supported by a surface comprising a material not soluble in an acid.

14. The method of claim 1 wherein the plasma-exposed yttria-coated constituent is dehydrated by applying an unsaturated flexible moisture wicking material to a latently hydrated surface of the plasma-exposed yttria-coated constituent.

15. A method for preventing corrosion of a plasma-exposed yttria-coated constituent from ambient acidic hydrolysis wherein the plasma-exposed yttria-coated constituent comprises a hydrolysable acid precursor, the method comprising:
   removing the plasma-exposed yttria-coated constituent from a semiconductor processing assembly;
   binding the plasma-exposed yttria-coated constituent with flexible moisture wicking material, than hydrolyzing the hydrolysable acid precursor with an overwhelming aqueous admixture to form a vitiated acidic compound, wherein the flexible moisture wicking material pulls the vitiated acidic compound away from the plasma-exposed yttria-coated constituent with capillary action, the hydrolysable acid precursor comprises fluorine, chlorine or a combination thereof, and the overwhelming aqueous admixture is applied for at least about 30 minutes;
   dehydrating the plasma-exposed yttria-coated constituent with additional flexible moisture wicking material to pull a latent amount of the vitiated acidic compound away from the plasma-exposed yttria-coated constituent; and isolating the plasma-exposed yttria-coated constituent from ambient moisture in a moisture obstructing enclosure.

* * * * *